US012701922B2

(12) United States Patent
Liu et al.

(10) Patent No.: US 12,701,922 B2
(45) Date of Patent: Aug. 4, 2026

(54) INTERDIGITAL RESONATOR AND FILTER

(71) Applicant: Wuhan MEMSonics Technologies Co., Ltd., Wuhan (CN)

(72) Inventors: Wenjuan Liu, Wuhan (CN); Zhiwei Wen, Wuhan (CN); Min Zeng, Wuhan (CN); Shishang Guo, Wuhan (CN); Bowoon Soon, Wuhan (CN); Chengliang Sun, Wuhan (CN)

(73) Assignee: WUHAN MEMSONICS TECHNOLOGIES CO., LTD., Wuhan (CN)

( * ) Notice: Subject to any disclaimer, the term of this patent is extended or adjusted under 35 U.S.C. 154(b) by 93 days.

(21) Appl. No.: 18/938,564

(22) Filed: Nov. 6, 2024

(65) Prior Publication Data

US 2025/0338773 A1     Oct. 30, 2025

(30) Foreign Application Priority Data

Apr. 25, 2024     (CN) .......................... 202410505017.6

(51) Int. Cl.
*H10N 30/87*          (2023.01)
*H03H 9/54*          (2006.01)
(Continued)

(52) U.S. Cl.
CPC ............ *H10N 30/872* (2023.02); *H03H 9/54* (2013.01); *H03H 9/02228* (2013.01); *H03H 9/14541* (2013.01)

(58) Field of Classification Search
CPC .. H03H 3/02; H03H 9/13; H03H 9/02; H03H 9/25; H03H 9/54; H03H 9/64; H03H 9/02228; H03H 9/14541; H10N 30/872
See application file for complete search history.

(56) References Cited

U.S. PATENT DOCUMENTS

| | | | | |
|---|---|---|---|---|
| 7,034,435 B2 * | 4/2006 | Hakamada | ......... | H03H 9/02897 |
| | | | | 333/194 |
| 11,689,182 B2 * | 6/2023 | Kasamatsu | .......... | H03H 9/6483 |
| | | | | 310/313 B |

(Continued)

FOREIGN PATENT DOCUMENTS

| | | | |
|---|---|---|---|
| CN | 116131803 A | 5/2023 |
| CN | 117277988 A | 12/2023 |

(Continued)

OTHER PUBLICATIONS

Chinese First Office Action dated Aug. 16, 2024 issued in CN application No. 202410505017.6.

*Primary Examiner* — Quan Tra
(74) *Attorney, Agent, or Firm* — Scully, Scott, Murphy & Presser, P.C.

(57)          ABSTRACT

Disclosed are an interdigital resonator and a filter. The interdigital resonator includes a piezoelectric layer and an interdigital transducer located on one side of the piezoelectric layer. The electrode fingers include a double-layer electrode structure and at least one scattering structure provided in the double-layer electrode structure. The double-layer electrode structure includes at least two laminated electrode layers. The scattering structure includes scattering holes and scattering media provided in the scattering holes. The scattering holes penetrate through at least a part of the double-layer electrode structure. The acoustic impedance of the scattering medium is different from the acoustic impedance of an electrode layer where the scattering medium is located.

18 Claims, 16 Drawing Sheets

(51) Int. Cl.
    *H03H 9/02*       (2006.01)
    *H03H 9/145*     (2006.01)

(56)            References Cited

U.S. PATENT DOCUMENTS

| | | | |
|---|---|---|---|
| 2019/0181830 A1 | 6/2019 | Xu | |
| 2021/0408998 A1* | 12/2021 | Esquius Morote | H03H 9/6483 |
| 2023/0198495 A1* | 6/2023 | Ouchi ................ | H03H 9/02228 |
| | | | 310/313 A |

FOREIGN PATENT DOCUMENTS

| | | | |
|---|---|---|---|
| CN | 117394819 A | 1/2024 | |
| WO | 2023106334 A1 | 6/2023 | |

* cited by examiner

INTERDIGITAL RESONATOR AND FILTER

CROSS-REFERENCE TO RELATED APPLICATION

The present disclosure claims the priority to Chinese Patent Application no. 202410505017.6, filed with the China National Intellectual Property Administration on Apr. 25, 2024 and entitled "INTERDIGITAL RESONATOR AND FILTER", which is incorporated herein by reference in its entirety.

TECHNICAL FIELD

The present disclosure relates to the technical field of resonators, and in particular, to an interdigital resonator and a filter.

BACKGROUND

As people have higher and higher requirements on the data transmission rate, communication spectrum resources become more and more crowded, and frequency band resources of high frequency, low delay and wide channel such as 5G and 6G are launched in the wireless communication industry. An acoustic filter serving as the core of a radio frequency front end faces technical challenges such as high frequency, large bandwidth and high power capacity.

The interdigital resonator, due to its unique performances such as high frequency and large bandwidth, becomes an optimal choice for implementing a 5G and a 6G radio frequency filter; however, the interdigital resonator also has the following problem: there are many spurious modes in the interdigital resonator, which may cause an in-band ripple of the filter. The low thermal conductivity of the piezoelectric layer of the interdigital resonator will not only lead to a poor heat dissipation performance of the interdigital resonator, but also affect the power capacity of the interdigital resonator. The piezoelectric layer of the interdigital resonator is relatively brittle, and is prone to fracture during the manufacturing process.

SUMMARY

The present disclosure provides an interdigital resonator and a filter.

According to a first aspect, an embodiment of the present disclosure provides an interdigital resonator, including an interdigital transducer and a piezoelectric layer, wherein the interdigital transducer being located on one side of the piezoelectric layer;

the interdigital transducer includes at least two electrode fingers;

the electrode fingers include a double-layer electrode structure and at least one scattering structure provided in the double-layer electrode structure; the double-layer electrode structure includes at least two laminated electrode layers; and the scattering structure includes scattering holes and a scattering medium provided in each of the scattering holes, the scattering hole penetrates through at least a part of the double-layer electrode structure, and an acoustic impedance of the scattering medium is different from an acoustic impedance of an electrode layer where the scattering medium is located.

In some embodiments, the double-layer electrode structure includes a first electrode layer and a second electrode layer that are laminated, the second electrode layer being located on the side of the first electrode layer away from the piezoelectric layer;

the scattering structure includes first scattering holes and first scattering media provided in the first scattering holes;

the first scattering holes penetrate through at least a part of the first electrode layer;

an acoustic impedance of the first scattering medium is different from the acoustic impedance of the first electrode layer.

In some embodiments, a material of the first electrode layer is different from a material of the second electrode layer;

the acoustic impedance of the first scattering medium is the same as an acoustic impedance of the second electrode layer.

In some embodiments, the double-layer electrode structure includes a first electrode layer and a second electrode layer that are laminated, the second electrode layer being located on the side of the first electrode layer away from the piezoelectric layer;

the scattering structure includes second scattering holes and second scattering media provided in the second scattering holes;

the second scattering holes penetrate through at least a part of the second electrode layer;

an acoustic impedance of the second scattering medium is different from an acoustic impedance of the second electrode layer.

In some embodiments, the double-layer electrode structure includes a first electrode layer and a second electrode layer that are laminated, the second electrode layer being located on the side of the first electrode layer away from the piezoelectric layer;

the scattering structure includes first scattering holes, second scattering holes, first scattering media provided in the first scattering holes, and second scattering media provided in the second scattering holes;

the first scattering holes penetrate through at least a part of the first electrode layer, and an acoustic impedance of the first scattering medium is different from an acoustic impedance of the first electrode layer;

the second scattering holes penetrate through at least a part of the second electrode layer, and an acoustic impedance of the second scattering medium is different from an acoustic impedance of the second electrode layer.

In some embodiments, the double-layer electrode structure includes a first electrode layer and a second electrode layer that are laminated, the second electrode layer being located on the side of the first electrode layer away from the piezoelectric layer;

a vertical projection of the second electrode layer on the piezoelectric layer at least partially overlaps with a vertical projection of the first electrode layer on the piezoelectric layer;

a shape of the vertical projection of the first electrode layer on the piezoelectric layer includes a polygon or an irregular shape;

a shape of the vertical projection of the second electrode layer on the piezoelectric layer includes a polygon or an irregular shape.

In some embodiments, the electrode refers to a plurality of scattering structures, and the plurality of scattering structures are arranged in an array in the double-layer electrode structure.

In some embodiments, the double-layer electrode structure includes a first electrode layer and a second electrode layer that are laminated, the second electrode layer being located on the side of the first electrode layer away from the piezoelectric layer;

the first electrode layer includes at least one of gold, copper, silver, aluminum, titanium, tungsten, chromium, molybdenum, platinum, graphene, diamond, and silicon carbide;

the second electrode layer includes at least one of gold, copper, silver, aluminum, titanium, tungsten, chromium, molybdenum, platinum, graphene, diamond, and silicon carbide.

In some embodiments, the interdigital resonator includes a surface acoustic wave resonator, a Lamb wave resonator, a laterally excited acoustic wave resonator, or a laterally vibration resonator.

According to a second aspect, an embodiment of the present disclosure provides a filter. The filter includes the interdigital resonator according to the first aspect.

It should be appreciated that the content as described in this part is neither intended to identify key or critical features of embodiments of the present disclosure, nor to limit the scope of the present disclosure. Other features of the present disclosure will become readily understood from the following description.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of this application, and a person of ordinary skill in the art may still derive other accompanying drawings from these accompanying drawings without creative efforts.

DETAILED DESCRIPTION OF EMBODIMENTS

For making those skilled in the art understand the solutions of some embodiments of the present disclosure better, hereinafter, the technical solutions in the embodiments of the present disclosure will be described clearly and thoroughly with reference to the accompanying drawings of embodiments of the present disclosure. Obviously, the embodiments as described are only some of the embodiments of the present disclosure, and are not all the embodiments. All other embodiments obtained by a person of ordinary skill in the art based on the embodiments of the present disclosure without any inventive effort shall all fall within the scope of protection of the present disclosure.

It should be noted that the terms "first", "second" etc., in the description, claims, and accompanying drawings of the present disclosure are used to distinguish similar objects, and are not necessarily used to describe a specific sequence or order. It should be understood that the data so used may be interchanged where appropriate so that the embodiments of the present disclosure described herein can be implemented in sequences other than those illustrated or described herein. In addition, the terms "include" and "have", and any variations thereof are intended to cover a non-exclusive inclusion, for example, a process, method, system, product, or device that includes a series of steps or units is not necessarily limited to those steps or units that are clearly listed, but may include other steps or units that are not clearly listed or inherent to such process, method, product, or device. The orientation or position relationships indicated by terms such as "upper", "lower", "left", "right" etc. are orientation or position relationships based on the accompanying drawings, are only used to describe the relative position relationship among the components or constituent parts, and does not specifically limit the specific installation orientation of the components or constituent parts.

Figure 1:
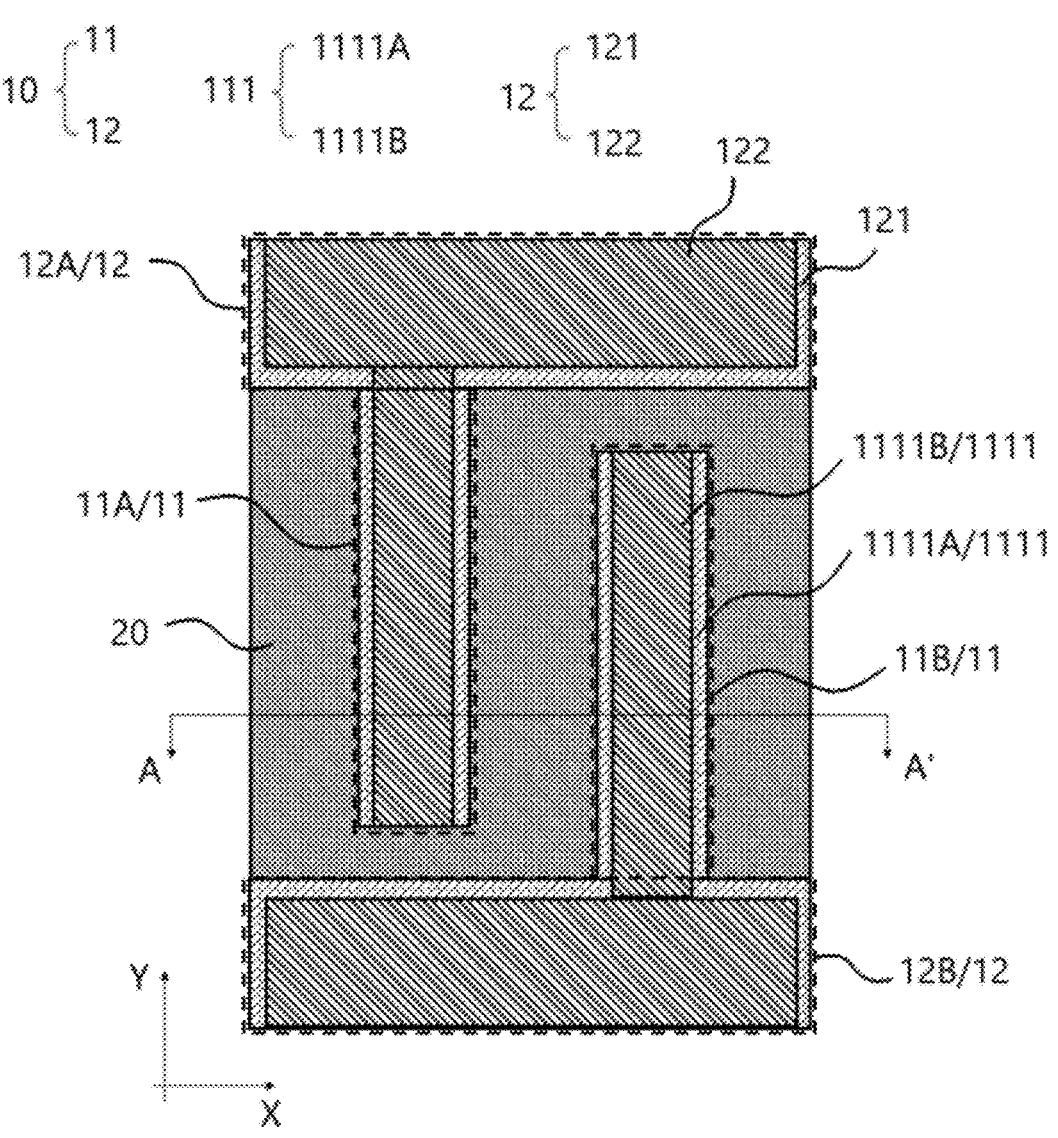
FIG. 1 is a schematic structural diagram of an interdigital resonator provided in an embodiment of the present disclosure.
Figure 2:
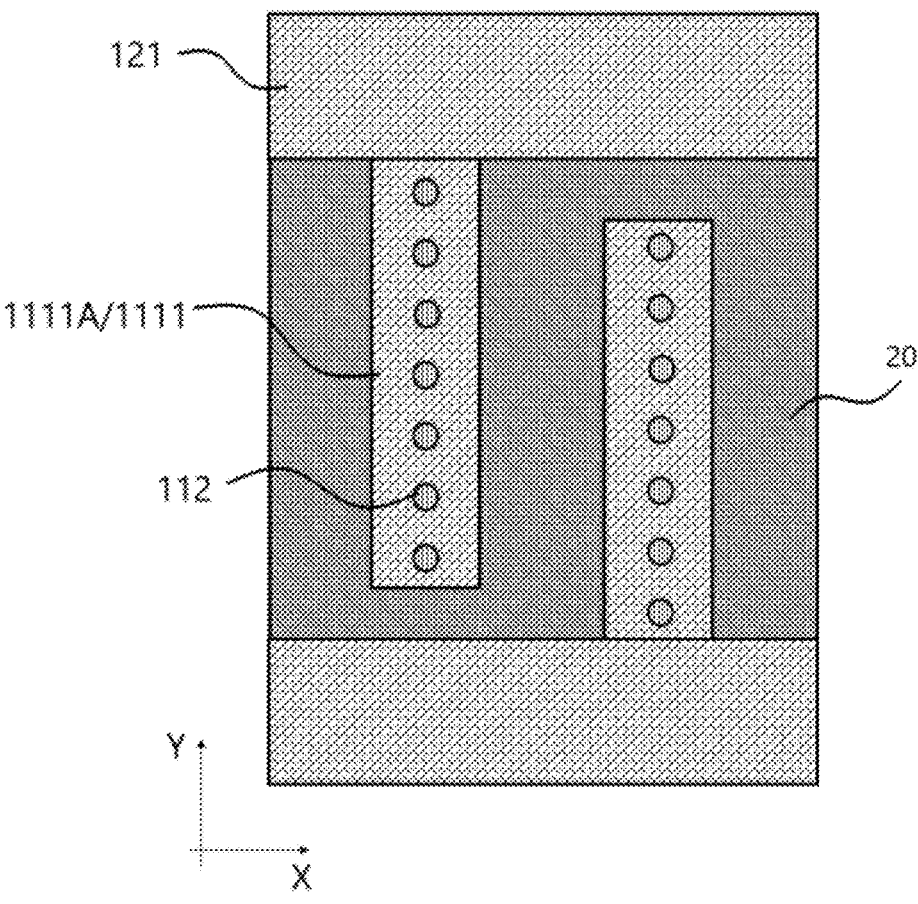
FIG. 2 is a partial structural schematic diagram of the interdigital resonator provided in FIG. 1.
Figure 3:
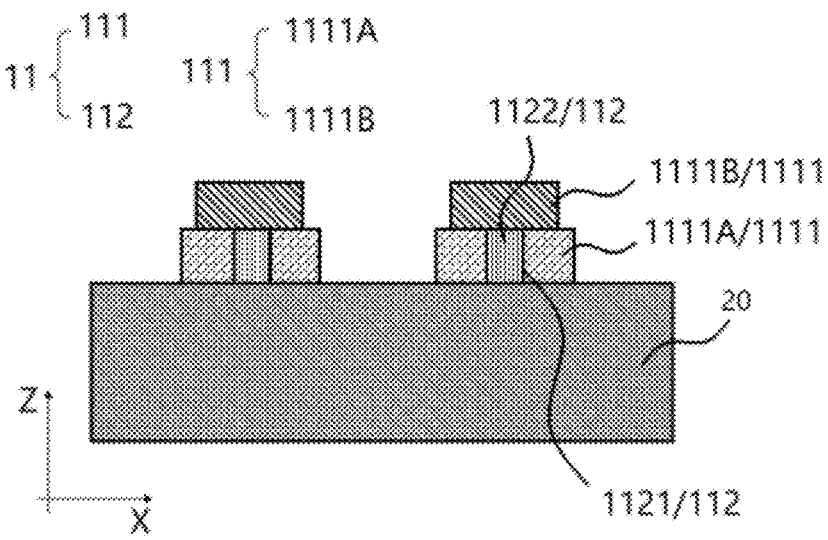
FIG. 3 is a schematic diagram of a sectional structure of the interdigital resonator provided in FIG. 1 along a section line A-A'.

FIG. 1 is a schematic structural diagram of an interdigital resonator provided in an embodiment of the present disclosure. FIG. 2 is a partial structural schematic diagram of the interdigital resonator provided in FIG. 1. FIG. 3 is a schematic diagram of a sectional structure of the interdigital resonator provided in FIG. 1 along a section line A-A'. With reference to FIGS. 1, 2 and 3, the interdigital resonator in the embodiment of the present disclosure includes an interdigital transducer 10 and a piezoelectric layer 20. The interdigital transducer 10 is located on one side of the piezoelectric layer 20. The interdigital transducer 10 includes at least two electrode fingers 11. The electrode fingers 11 include a double-layer electrode structure 111 and at least one scattering structure 112 provided in the double-layer electrode structure 111. The double-layer electrode structure 111 includes at least two laminated electrode layers 1111. The scattering structure 112 includes scattering holes 1121 and scattering media 1122 provided in the scattering holes 1121, the scattering holes 1121 penetrate through at least a part of the double-layer electrode structure 111, and the acoustic impedance of the scattering medium 1122 is different from the acoustic impedance of an electrode layer 1111 where the scattering medium 1122 is located.

Exemplarily, refer to FIG. 1, a first direction X and a second direction Y are perpendicular to each other, and the interdigital transducer 10 includes two electrode fingers 11 (i.e. a first electrode finger 11A and a second electrode finger 11B) and two bus bars 12 (i.e. a first bus bar 12A and a second bus bar 12B), the first electrode finger 11A is connected to the first bus bar 12A, and the second electrode finger 11B is connected to the second bus bar 12B. The first bus bar 21 A and the second bus bar 21 B extend in the first direction X and are arranged in the second direction Y, and the first electrode fingers 22 A and the second electrode fingers 22 B extend in the second direction Y and are arranged alternately in the first direction X. It should be noted that, the number of first electrode fingers 11A and the number of second electrode fingers 11B included in the interdigital transducer 10 are not limited in the embodiment of the present disclosure, and a person skilled in the art may set the number of electrode fingers 11 on his own initiative according to requirements.

Refer to FIGS. 1 and 3, the electrode finger 11 in the embodiment of the present disclosure includes two electrode layers 1111 (i.e. a first electrode layer 1111A and a second electrode layer 1111B) laminated in sequence in a third direction Z, and the bus bar 12 includes two bus layers (i.e. a first bus layer 121 and a second bus layer 122) laminated in sequence in the third direction Z, wherein the third direction Z is perpendicular to the first direction X and the second direction Y respectively; the first electrode layer 1111A and the first bus layer 121 are arranged on the same layer; and the second electrode layer 1111B and the second bus layer 122 are provided in the same layer. It can be understood that, in manufacturing the interdigital transducer as shown in FIG. 1, the first electrode layer 1111A and the first bus layer 121 may be formed in the same process step, and the second electrode layer 1111B and the second bus layer 122 may be formed in the same process step.

It can be understood that, the larger the cross-sectional area of the resistor is, the smaller the resistance value is, and the smaller the ohmic loss is; however, the interdigital transducer in the embodiment of the present disclosure is equivalent to a resistor. Compared with the technical solution in the prior art that an electrode finger of an interdigital transducer only includes one electrode layer, in the embodiments of the present disclosure, the electrode finger 11 includes at least two laminated electrode layers 1111, which can increase the thickness of the interdigital transducer 10, reduce the ohmic loss of the interdigital transducer 10, and reduce the generation of Joule heat, thereby being beneficial to improving the heat dissipation performance and power capacity of the interdigital resonator. The increase in thickness of interdigital transducer 10 may also improve the support of the interdigital transducer to the piezoelectric layer during the manufacturing of the interdigital transducer.

Refer to FIGS. 2 and 3, the electrode finger 11 in the embodiment of the present disclosure further includes a scattering structure 112 provided in the double-layer electrode structure 111. The scattering structure 112 includes scattering holes 1121 penetrating through at least a part of the double-layer electrode structure 111 and scattering media 1122 provided in the scattering hole 1121, and the arrangement of the scattering holes 1121 can form a scattering boundary on the electrode finger 11, so that a spurious mode of the interdigital resonator is scattered, and the spurious mode can be effectively suppressed. By providing the scattering media 1122 in the scattering holes 1121, and arranging the acoustic impedance of the scattering medium 1122 to be different from the acoustic impedance of the electrode layer 1111 where the scattering medium 1122 is located, the suppression of the scattering structure 112 on the spurious mode can be further improved. The diffusion medium 1122 may be air, and may also be at least one of gold, copper, silver, aluminum, titanium, tungsten, chromium, molybdenum, platinum, graphene, diamond, and silicon carbide, and is preferably a material having high electrical conductivity and high thermal conductivity, and a material having relatively large acoustic impedance with respect to an electrode material.

Refer to FIG. 2, the shape of the vertical projection of the scattering structure 112 on the piezoelectric layer 20 is a circle. It should be noted that, the shape of the vertical projection of the scattering structure 112 on the piezoelectric layer 20 is not limited in the embodiment of the present disclosure, it may also be elliptical, polygonal (e.g. triangular, quadrilateral) or irregular pattern (e.g. a closed figure included of irregular curved edges, a closed figure included of irregular curved edges and straight edges), and an irregular pattern generally refers to a graphic that cannot be defined and named. It should also be noted that, whether the scattering structures 112 on the same electrode finger 11 or different electrode fingers 11 are the same is not limited in the embodiments of the present disclosure, and may be set by a person skilled in the art on his own initiative according to actual requirements.

Figure 4:
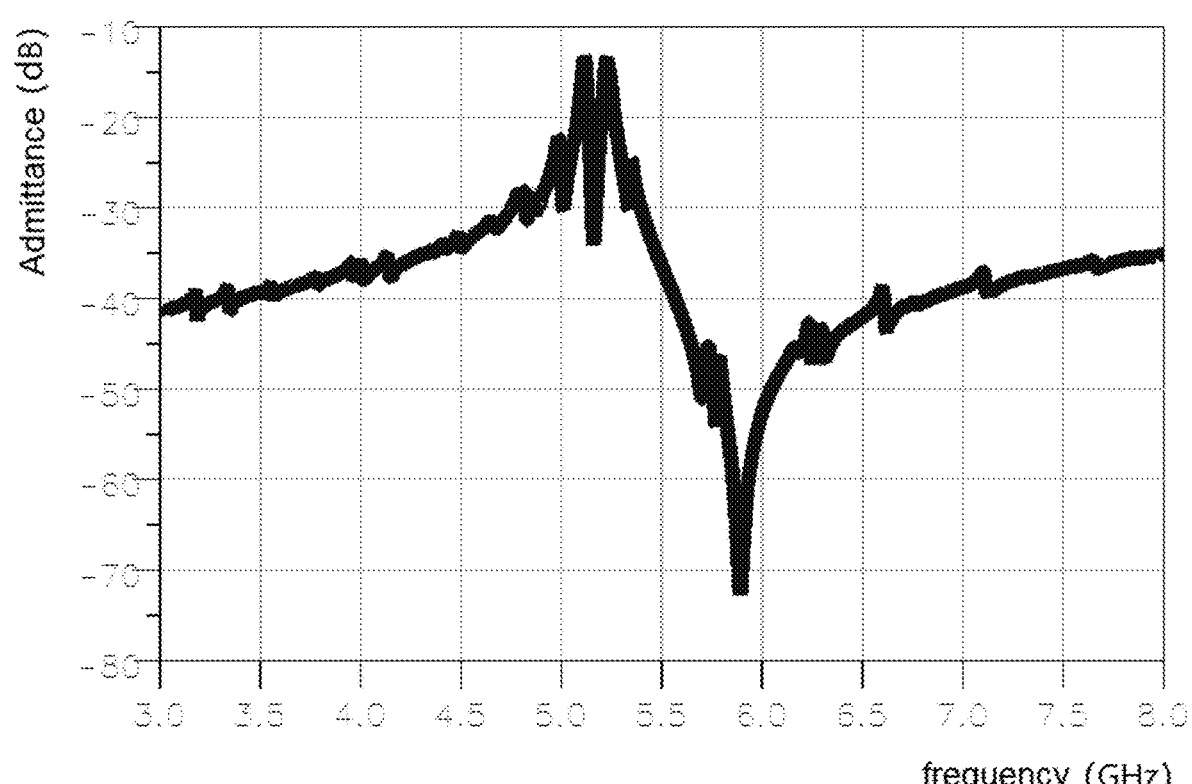
FIG. 4 is an admittance curve diagram of an interdigital resonator provided in the prior art.
Figure 5:
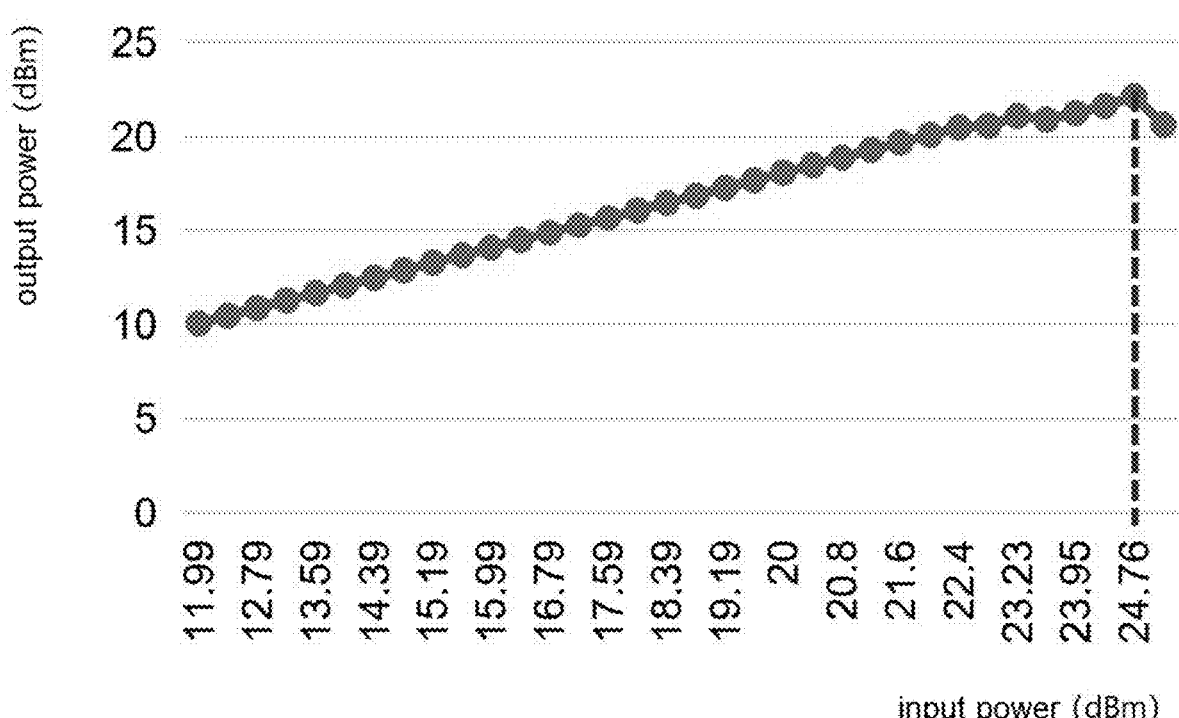
FIG. 5 is an input-output power relationship diagram of the interdigital resonator provided in the prior art.
Figure 6:
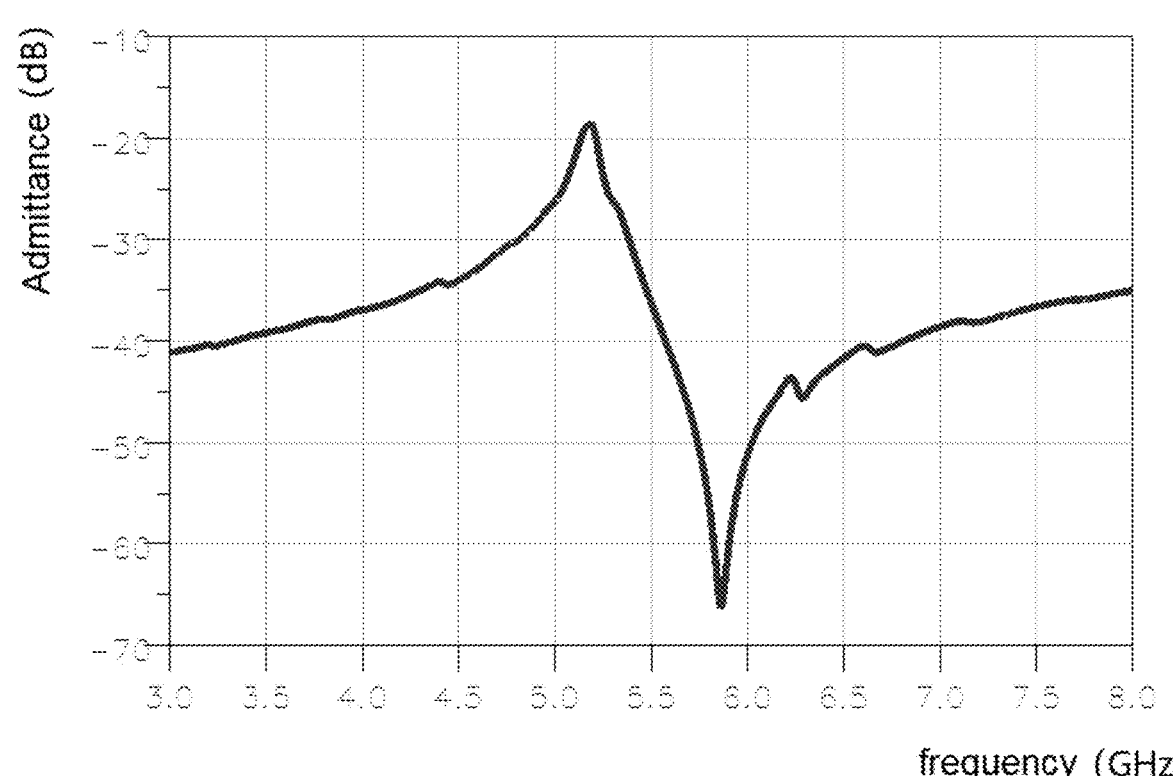
FIG. 6 is an admittance curve diagram of an interdigital resonator provided in an embodiment of the present disclosure.
Figure 7:
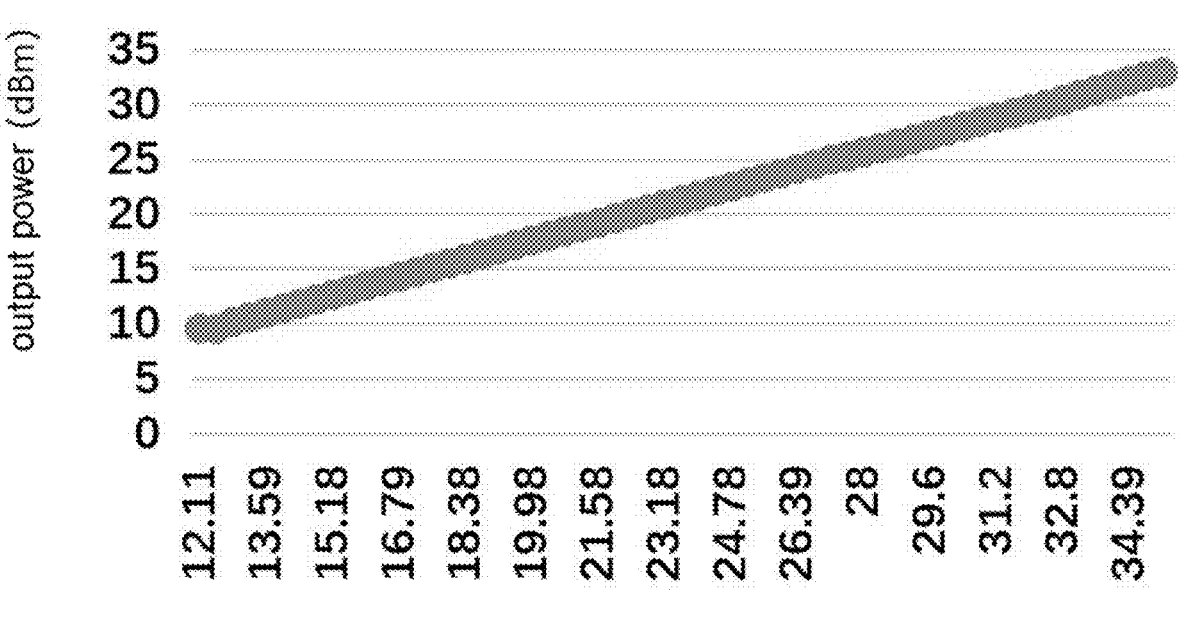
FIG. 7 is an input-output power relationship diagram of an interdigital resonator provided in an embodiment of the present disclosure.

FIG. 4 is an admittance curve diagram of an interdigital resonator provided in the prior art. FIG. 5 is an input-output power relationship diagram of the interdigital resonator provided in the prior art. FIG. 6 is an admittance curve diagram of an interdigital resonator provided in an embodiment of the present disclosure. FIG. 7 is an input-output power relationship diagram of an interdigital resonator provided in an embodiment of the present disclosure. The electrode finger in the interdigital resonator provided in the prior art only includes one electrode layer, the thickness of the electrode finger in the prior art in the third direction Z is less than the thickness of the electrode finger 11 in the embodiment of the present disclosure in the third direction Z, the bus bar also only includes one layer of bus bar, and the electrode finger is provided with no scattering structure penetrating through at least a part of the piezoelectric layer. Comparing FIG. 4 with FIG. 6, it can be determined that the spurious mode of the interdigital resonator in the embodiments of the present disclosure is effectively suppressed. Comparing FIG. 5 with FIG. 7, it can be determined that the maximum input power of the interdigital resonator in the embodiments of the present disclosure can reach 35.08 dBm, the maximum input power of the interdigital resonator in the prior art can only reach 24.76 dBm, and therefore the power capacity is obviously improved.

Refer to FIGS. 1 and 3, the double-layer electrode structure 111 includes a first electrode layer 1111A and a second electrode layer 1111B which are laminated, and the second electrode layer 1111B is located on the side of the first electrode layer 1111A away from the piezoelectric layer 20. The scattering structure 112 includes first scattering holes 1121A and first scattering media 1122A provided in the first scattering holes 1121A. The first scattering holes 1121A penetrate through at least a part of the first electrode layer 1111A. The acoustic impedance of the first scattering medium 1122A is different from the acoustic impedance of the first electrode layer 1111A.

As a feasible implementation, the scattering structure 112 shown in FIG. 3 is provided in the first electrode layer 1111A, and penetrates through the first electrode layer 1111A. Specifically, the first scattering hole 1121A penetrates through the first electrode layer 1111A, and the acoustic impedance of the first scattering medium 1122 A filled in the first scattering hole 1121A is different from the acoustic impedance of the first electrode layer 1111A. In the embodiment of the present disclosure, the spurious mode can be prevented by providing the scattering structure 112.

The manufacturing method for the interdigital resonator shown in FIGS. 1 to 3 according to the embodiments of the present disclosure is as follows: step 1, preparing a piezoelectric layer 20; step 2, depositing and patterning to form a first electrode layer 1111A, a first scattering hole 1121A and a first bus layer 121 on one side of the piezoelectric layer 20, wherein the first scattering hole 1121A penetrates through the first electrode layer 1111A; and step 3, filling the first scattering hole 1121A with the first scattering medium 1122A, wherein the acoustic impedance of the first scattering medium 1122A is different from that of the first electrode layer 1111A; step 4, depositing and patterning to form a second electrode layer 1111B on the side of the first electrode layer 1111A away from the piezoelectric layer 20, and depositing and patterning to form a second bus layer 122 on the side of the first bus layer 121 away from the piezoelectric layer 20.

In other feasible implementations, the scattering structure 112 may also be arranged in such a way that the first scattering holes 1121A penetrate through a part of the first electrode layer 1111A. It should be noted that, whether the first scattering holes 1121A completely penetrate through the first electrode layer 1111A is not limited in the embodiment of the present disclosure, and may be set by a person skilled in the art on his own initiative according to actual requirements.

Figure 8:
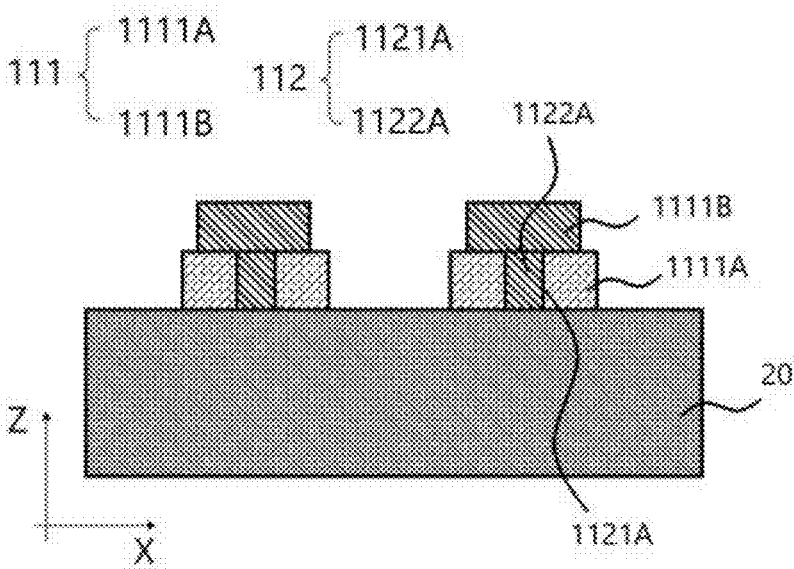
FIG. 8 is a schematic diagram of another sectional structure of the interdigital resonator provided in FIG. 1 along the section line A-A'.

FIG. 8 is a schematic diagram of another sectional structure of the interdigital resonator provided in FIG. 1 along the section line A-A'. Refer to FIG. 8, the material of the first electrode layer 1111A and the material of the second electrode layer 1111B are different. The acoustic impedance of the first scattering medium 1122A is the same as the acoustic impedance of the second electrode layer 1111B.

In the embodiment of the present disclosure, by arranging the acoustic impedance of the first scattering medium 1122A to be the same as the acoustic impedance of the second electrode layer 1111B, that is, the material of the first scattering medium 1122A is the same as that of the second electrode layer 1111B, the step 3 and the step 4 in the method for manufacturing an interdigital resonator can be combined into one step, which is beneficial to reducing the manufacturing steps of the interdigital resonator and improving the manufacturing efficiency.

Figure 9:
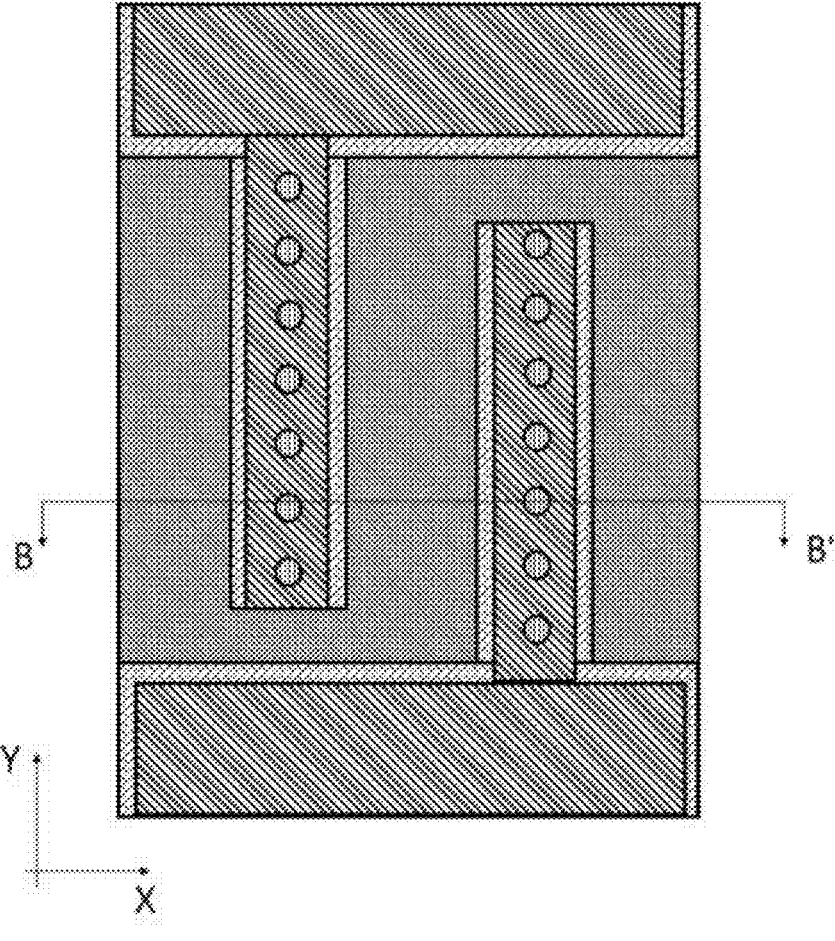
FIG. 9 is a schematic structural diagram of another interdigital resonator provided in an embodiment of the present disclosure.
Figure 10:
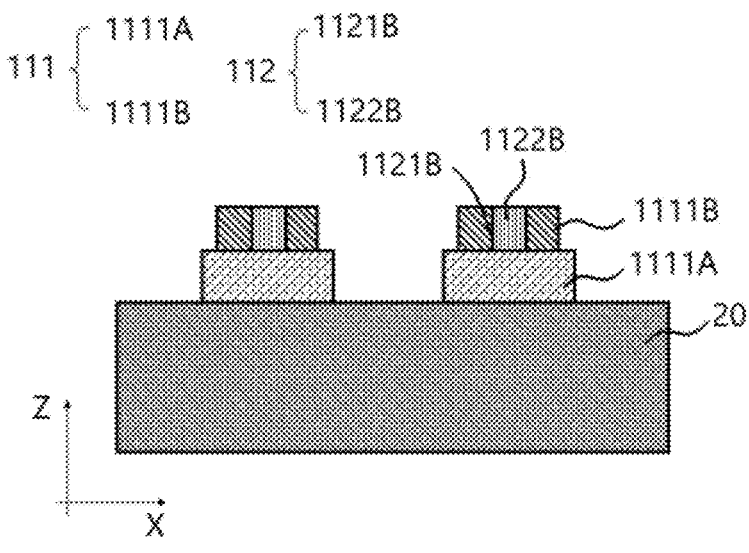
FIG. 10 is a schematic diagram of a sectional structure of the interdigital resonator provided in FIG. 9 along a section line B-B'.

FIG. 9 is a schematic structural diagram of another interdigital resonator provided in an embodiment of the present disclosure. FIG. 10 is a schematic diagram of a sectional structure of the interdigital resonator provided in FIG. 9 along a section line B-B'. Refer to FIGS. 9 and 10, the double-layer electrode structure 111 includes a first electrode layer 1111A and a second electrode layer 1111B which are laminated, and the second electrode layer 1111B is located on the side of the first electrode layer 1111A away from the piezoelectric layer 20. The scattering structure 112 includes second scattering holes 1121B and second scattering media 1122B provided in the second scattering holes 1121B. The second scattering holes 1121B penetrate through at least a part of the second electrode layer 1111B. The acoustic impedance of the second scattering medium 1122B is different from the acoustic impedance of the second electrode layer 1111B.

As a feasible implementation, the scattering structures 112 shown in FIGS. 9 and 10 are provided in the second electrode layer 1111B and penetrate through the second electrode layer 1111B. Specifically, the second scattering holes 1121B penetrate through the second electrode layer 1111B, and the acoustic impedance of the second scattering media 1122B filled in the second scattering holes 1121B is different from the acoustic impedance of the second electrode layer 1111b. In the embodiment of the present disclosure, the spurious mode can be prevented by providing the scattering structure 112.

The manufacturing method for the interdigital resonator shown in FIGS. 9 and 10 according to the embodiments of the present disclosure is as follows: step 1, preparing a piezoelectric layer 20; step 2, depositing and patterning to form a first electrode layer 1111A and a first bus layer 121 on one side of the piezoelectric layer 20; step 3, depositing and patterning to form a second electrode layer 1111B and a second scattering hole 1121B on the side of the first electrode layer 1111A away from the piezoelectric layer 20, and depositing and patterning to form a second bus layer 122 on the side of the first bus layer 121 away from the piezoelectric layer 20, wherein the second scattering hole 1121B penetrates through the second electrode layer 1111B; step 4, filling the second scattering hole 1121B with a second scattering medium 1122B, wherein the acoustic impedance of the second scattering medium 1122B is different from the acoustic impedance of the second electrode layer 1111B.

In other possible implementations, the scattering structure 112 can also be arranged in such a way that the second scattering holes 1121B penetrate through a part of the second electrode layer 1111B. It should be noted that, whether the second scattering holes 1121B completely penetrate through the second electrode layer 1111B is not limited in the embodiments of the present disclosure, and may be set by a person skilled in the art on his own initiative according to actual requirements.

Figure 11:
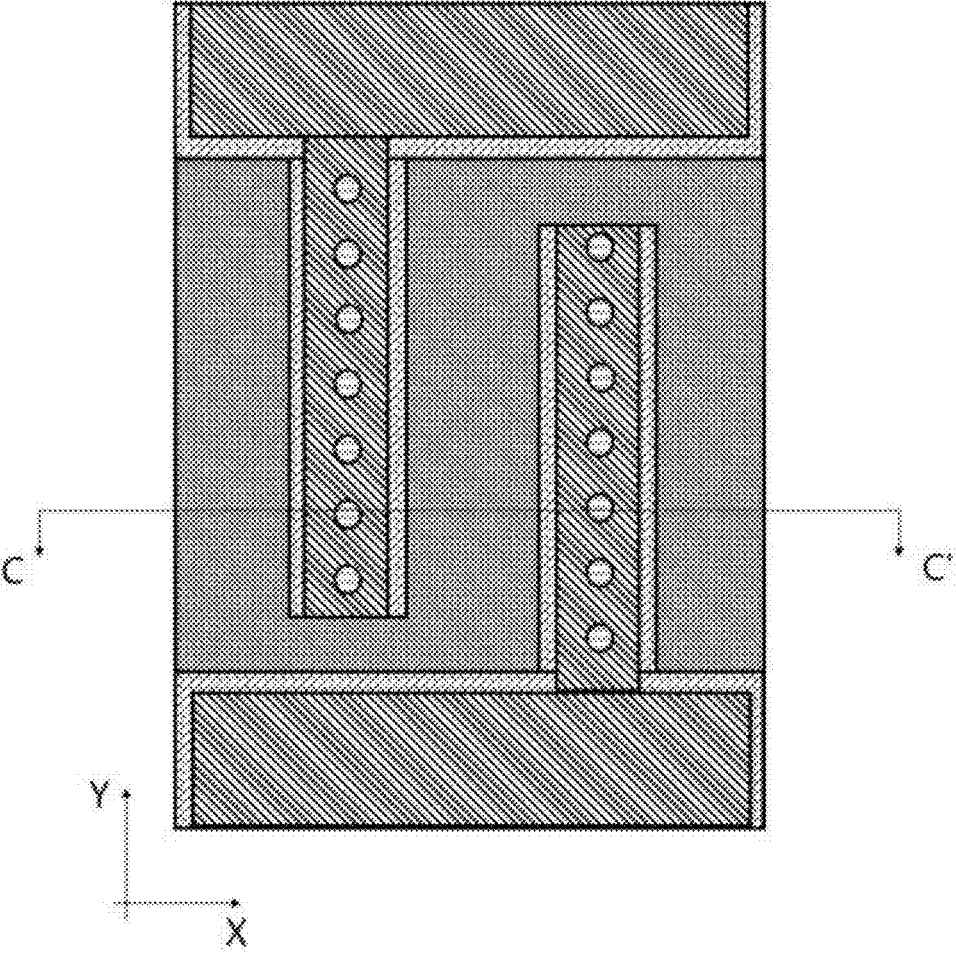
FIG. 11 is a schematic structural diagram of yet another interdigital resonator provided in an embodiment of the present disclosure.
Figure 12:
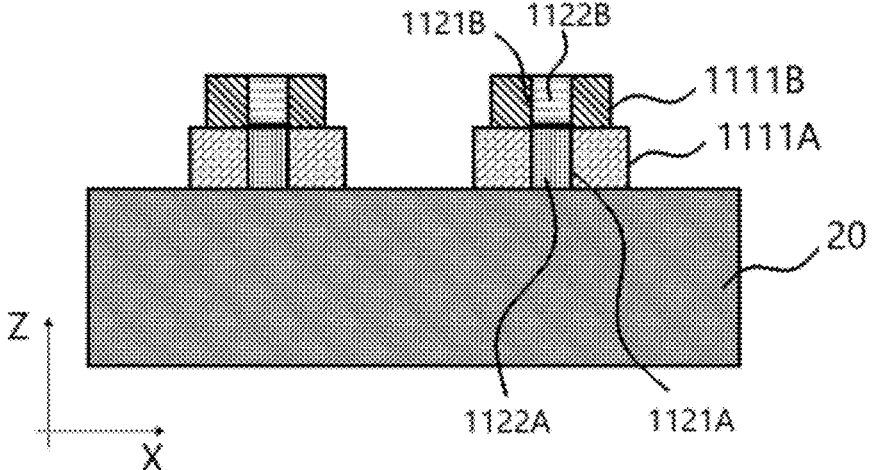
FIG. 12 is a schematic diagram of a sectional structure of the interdigital resonator provided in FIG. 11 along a section line C-C'.
Figure 13:
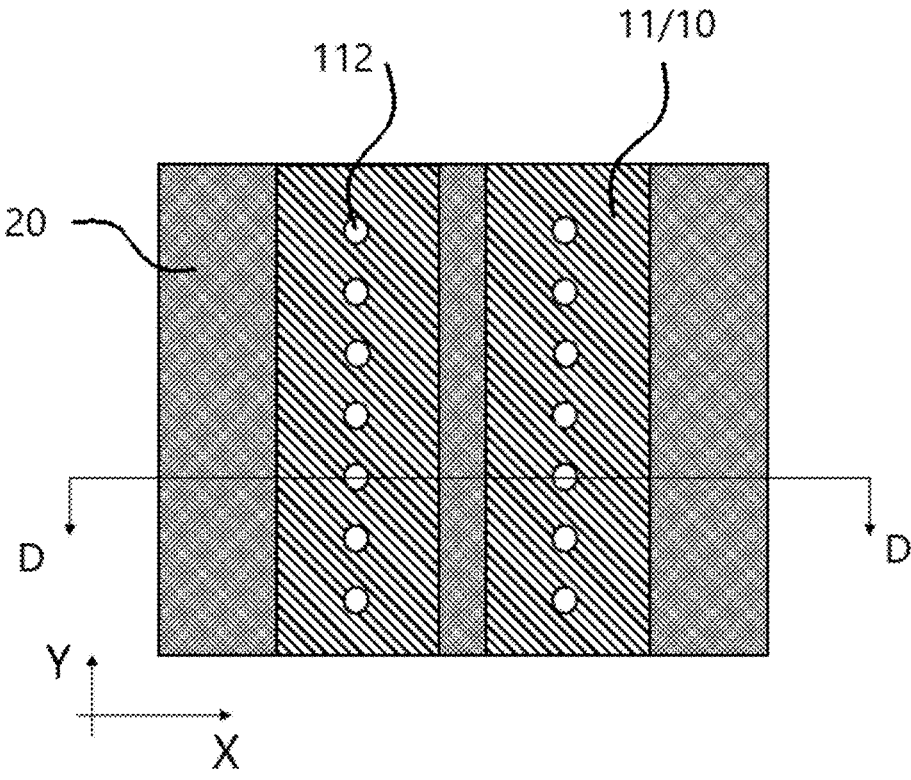
FIG. 13 is a schematic diagram of a partial structure of yet another interdigital resonator provided in an embodiment of the present disclosure.
Figure 14:
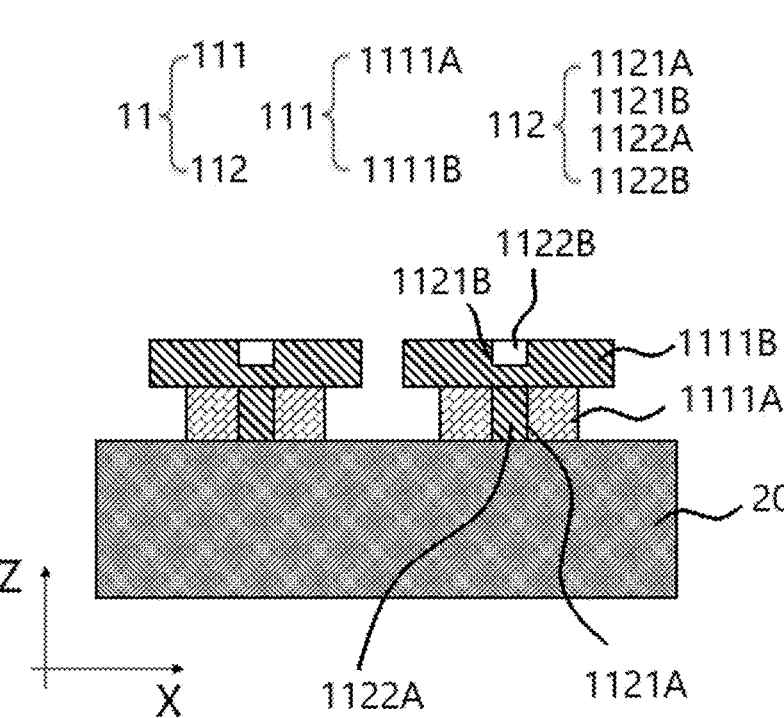
FIG. 14 is a schematic diagram of a sectional structure of the interdigital resonator provided in FIG. 13 along a section line D-D'.

FIG. 11 is a schematic structural diagram of yet another interdigital resonator provided in an embodiment of the present disclosure. FIG. 12 is a schematic diagram of a sectional structure of the interdigital resonator provided in FIG. 11 along a section line C-C'. FIG. 13 is a schematic diagram of a partial structure of yet another interdigital resonator provided in an embodiment of the present disclosure. FIG. 14 is a schematic diagram of a sectional structure of the interdigital resonator provided in FIG. 13 along a section line D-D'. Refer to FIGS. 11 to 14, the double-layer electrode structure 111 includes a first electrode layer 1111A and a second electrode layer 1111B, and the second electrode layer 1111B is located on the side of the first electrode layer 1111A away from the piezoelectric layer 20. The scattering structure 112 includes first scattering holes 1121A, second scattering holes 1121B, first scattering media 1122A provided in the first scattering holes 1121A, and second scattering media 1122B provided in the second scattering holes 1121B. The first scattering holes 1121A penetrate through at least a part of the first electrode layer 1111A, and the acoustic impedance of the first scattering medium 1122A is different from that of the first electrode layer 1111A. The second scattering holes 1121B penetrate through at least a part of the second electrode layer 1111B, and the acoustic impedance of the second scattering medium 1122B is different from the acoustic impedance of the second electrode layer 1111*b*.

As a feasible implementation, the scattering structures 112 shown in FIGS. 11 and 12 are provided in the first electrode layer 1111A and the second electrode layer 1111B, and penetrate through the first electrode layer 1111A and the second electrode layer 1111B, specifically, the first scattering holes 1121A penetrate through the first electrode layer 1111A, the acoustic impedance of the first scattering medium 1122A filled in the first scattering hole 1121A is different from the acoustic impedance of the first electrode layer 1111A, the second scattering holes 1121B penetrate through the second electrode layer 1111B, and the acoustic impedance of the second scattering medium 1122B filled in the second scattering hole 1121B is different from the acoustic impedance of the second electrode layer 1111B. The embodiments of the present disclosure can further improve the suppression of the spurious mode by providing the scattering structures 112 on both electrode layers.

The manufacturing method for the interdigital resonator shown in FIGS. 11 and 12 according to the embodiments of the present disclosure is as follows: step 1, preparing a piezoelectric layer 20; step 2, depositing and patterning to form a first electrode layer 1111A, a first scattering hole 1121A and a first bus layer 121 on one side of the piezoelectric layer 20, wherein the first scattering hole 1121A penetrates through the first electrode layer 1111A; and step 3, filling the first scattering hole 1121A with the first scattering medium 1122A, wherein the acoustic impedance of the first scattering medium 1122A is different from that of the first electrode layer 1111A; step 4, depositing and patterning to form a second electrode layer 1111B and second scattering holes 1121B on the side of the first electrode layer 1111A away from the piezoelectric layer 20, and depositing and patterning to form a second bus layer 122 on the side of the first bus layer 121 away from the piezoelectric layer 20, wherein the second scattering holes 1121B penetrate through the second electrode layer 1111B; step 5, filling the second scattering holes 1121B with second scattering media 1122B, wherein the acoustic impedance of the second scattering medium 1122B is different from the acoustic impedance of the second electrode layer 1111B. The vertical projections of the second scattering holes 1121B on the piezoelectric layer 20 in the interdigital resonator shown in FIGS. 11 and 12 overlap with the vertical projections of the first scattering holes 1121A on the piezoelectric layer 20. It should be noted that, the perpendicular projections, on the piezoelectric layer 20, of the second scattering holes 1121B in the interdigital resonator manufactured by using the method may also partially overlap with or not overlap with the perpendicular projections of the first scattering holes 1121A on the piezoelectric layer 20.

Another manufacturing method for the interdigital resonator shown in FIGS. 11 and 12 according to the embodiments of the present disclosure is as follows: step 1, preparing a piezoelectric layer 20; step 2, depositing and patterning to form a first electrode layer 1111A and a first bus layer 121 on one side of the piezoelectric layer 20; step 3, depositing and patterning to form a second electrode layer 1111B on the side of the first electrode layer 1111A away from the piezoelectric layer 20, and depositing and patterning to form a second bus layer 122 on the side of the first bus layer 121 away from the piezoelectric layer 20; step 4, etching, on the second electrode layer 1111B and the first electrode layer 1111A, second scattering holes 1121B penetrating through the second electrode layer 1111B and first scattering holes 1121A penetrating through the first electrode layer 1111A; step 5, filling the first scattering hole 1121A with the first scattering medium 1122A, wherein the acoustic impedance of the first scattering medium 1122A is different from that of the first electrode layer 1111A; step 6, filling the second scattering holes 1121B with second scattering media 1122B, wherein the acoustic impedance of the second scattering medium 1122B is different from the acoustic impedance of the second electrode layer 1111B. It should be noted that, the perpendicular projections, on the piezoelectric layer 20, of the second scattering holes 1121B in the interdigital resonator manufactured by using this method overlap with the perpendicular projections of the first scattering holes 1121A on the piezoelectric layer 20, or the perpendicular projections of the first scattering holes 1121A on the piezoelectric layer 20 are in the perpendicular projections of the second scattering holes 1121B on the piezoelectric layer 20.

As another feasible implementation, the scattering structure 112 shown in FIGS. 13 and 14 are provided in the first electrode layer 1111A and the second electrode layer 1111B, and penetrate through the first electrode layer 1111A and a part of the second electrode layer 1111B, specifically, the first scattering holes 1121A penetrate through the first electrode layer 1111A, the acoustic impedance of the first scattering medium 1122A filled in the first scattering hole 1121A is different from the acoustic impedance of the first electrode layer 1111A, the second scattering holes 1121B penetrate through a part of the second electrode layer 1111B, and the acoustic impedance of the second scattering medium 1122B filled in the second scattering hole 1121B is different from the acoustic impedance of the second electrode layer 1111B. The embodiments of the present disclosure can further improve the suppression of the spurious mode by providing the scattering structures 112 on both electrode layers.

The manufacturing method for the interdigital resonator shown in FIGS. 13 and 14 according to the embodiments of the present disclosure is as follows: step 1, preparing a piezoelectric layer 20; step 2, depositing and patterning to form a first electrode layer 1111A, a first scattering hole 1121A and a first bus layer 121 on one side of the piezoelectric layer 20, wherein the first scattering hole 1121A penetrates through the first electrode layer 1111A; and step 3, filling the first scattering hole 1121A with the first scattering medium 1122A, wherein the acoustic impedance of the first scattering medium 1122A is different from that of the first electrode layer 1111A; step 4, depositing and patterning to form a second electrode layer 1111B and a second scattering hole 1121B on the side of the first electrode layer 1111A away from the piezoelectric layer 20, and depositing and patterning to form a second bus layer 122 on the side of the first bus layer 121 away from the piezoelectric layer 20, wherein the second scattering holes 1121B penetrate through a part of the second electrode layer 1111B; step 5, filling the second scattering holes 1121B with second scattering media 1122B, wherein the acoustic impedance of the second scattering medium 1122B is different from the acoustic impedance of the second electrode layer 1111B. The vertical projections of the second scattering holes 1121B on the piezoelectric layer 20 in the interdigital resonator shown in FIGS. 13 and 14 overlap with the vertical projections of the first scattering holes 1121A on the piezoelectric layer 20. It should be noted that, the perpendicular projections, on the piezoelectric layer 20, of the second scattering holes 1121B in the interdigital resonator manufactured by using the method may also partially overlap with or not overlap with the perpendicular projections of the first scattering holes 1121A on the piezoelectric layer 20.

In other feasible implementations, the scattering structure 112 may also be arranged in such a way that the first scattering holes 1121A penetrate through a part of the first electrode layer 1111A, and the second scattering holes 1121B penetrate through the second electrode layer 1111B, or the first scattering holes 1121A penetrate through a part of the first electrode layer 1111A, and the second scattering holes 1121B penetrate through a part of the second electrode layer 1111B. It should be noted that, whether the first scattering holes 1121A completely penetrate through the first electrode layer 1111A and whether the second scattering holes 1121B completely penetrate through the second electrode layer 1111B are not limited in the embodiments of the present disclosure, and may be set by a person skilled in the art on his own initiative according to actual requirements.

Figure 15:
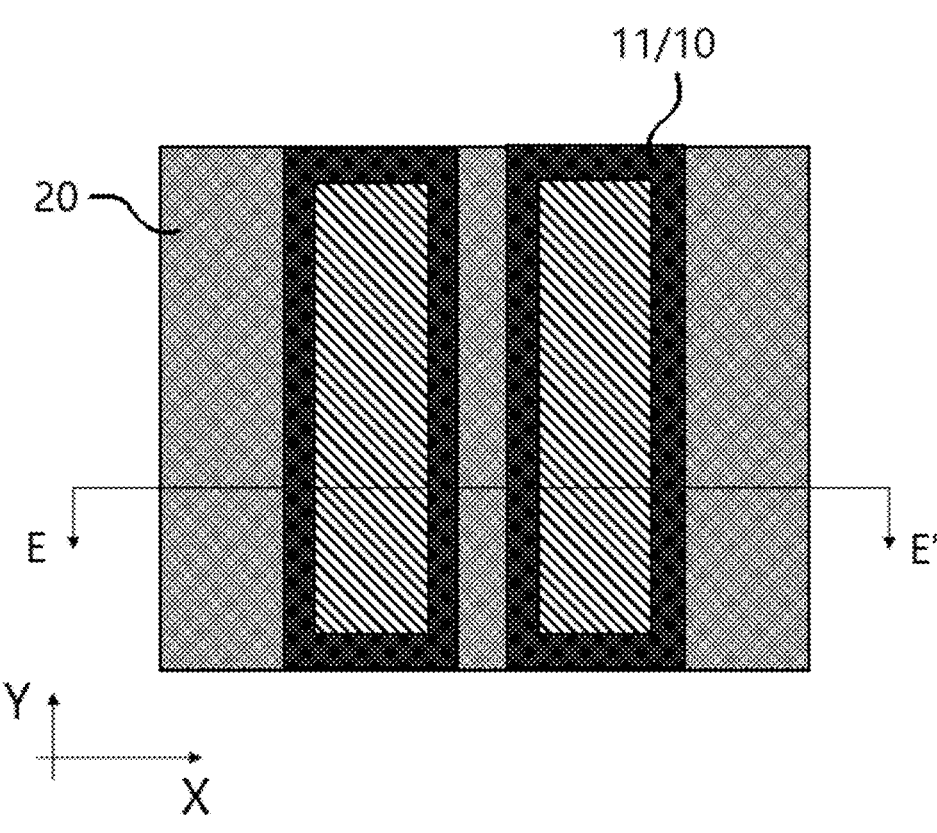
FIG. 15 is a schematic diagram of a partial structure of yet another interdigital resonator provided in an embodiment of the present disclosure.
Figure 16:
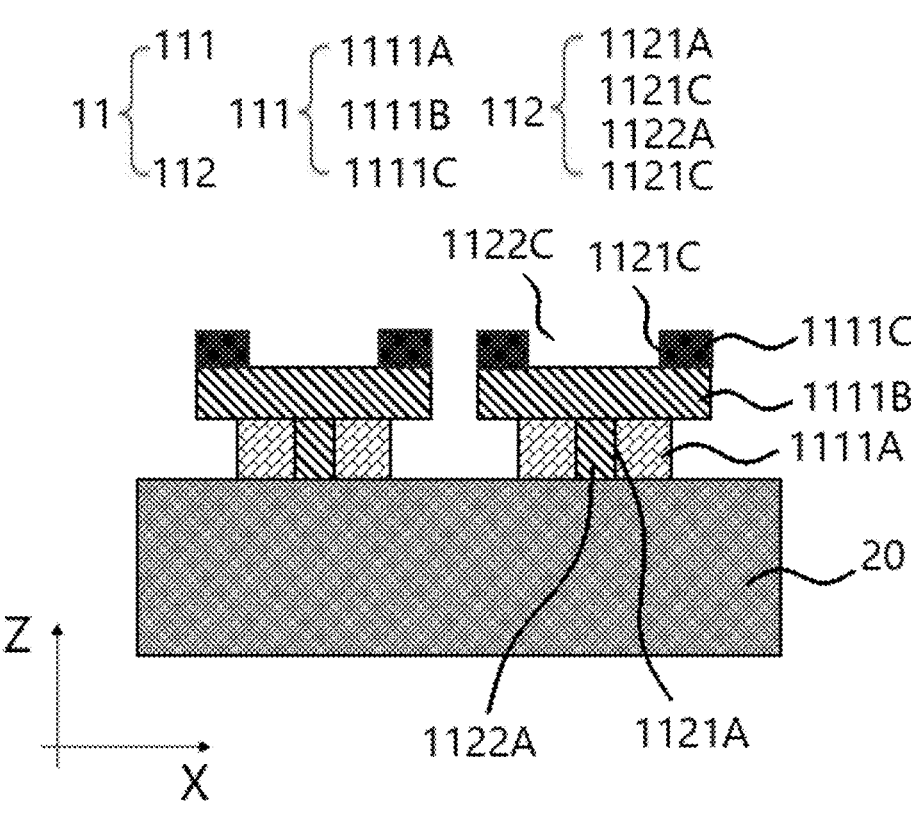
FIG. 16 is a schematic diagram of a sectional structure of the interdigital resonator provided in FIG. 15 along a section line E-E'.

FIG. 15 is a schematic diagram of a partial structure of yet another interdigital resonator provided in an embodiment of the present disclosure. FIG. 16 is a schematic diagram of a sectional structure of the interdigital resonator provided in FIG. 15 along a section line E-E'. Refer to FIGS. 15 and 16, the double-layer electrode structure 111 includes a first electrode layer 1111A, a second electrode layer 1111B and a third electrode layer 1111C that are laminated, wherein the second electrode layer 1111B is located on the side of the first electrode layer 1111A away from the piezoelectric layer 20, and the third electrode layer 1111C is located on the side of the second electrode layer 1111B away from the first electrode layer 1111A. The scattering structure 112 includes first scattering holes 1121A, third scattering holes 1121C, first scattering media 1122A provided in the first scattering holes 1121A, and third scattering media 1122C provided in the third scattering holes 1121C. The first scattering holes 1121A penetrate through at least a part of the first electrode layer 1111A, and the acoustic impedance of the first scattering medium 1122A is different from that of the first electrode layer 1111A. The third scattering holes 1121C penetrate through at least a part of the third electrode layer 1111C, and the acoustic impedance of the third scattering medium 1122C is different from the acoustic impedance of the third electrode layer 1111C.

As a feasible implementation, the scattering structures 112 shown in FIGS. 15 and 16 are provided in the first electrode layer 1111A and the third electrode layer 1111C, and penetrate through the first electrode layer 1111A and the third electrode layer 1111C penetrate, specifically, the first scattering holes 1121A penetrate through the first electrode layer 1111A, the acoustic impedance of the first scattering medium 1122A filled in the first scattering hole 1121A is different from an acoustic impedance of the first electrode layer 1111A, the third scattering holes 1121C penetrate through the third electrode layer 1111C, and the acoustic impedance of the third scattering medium 1122C filled in the third scattering hole 1121C is different from the acoustic impedance of the third electrode layer 1111C. The embodiments of the present disclosure can further improve the suppression of the spurious mode by providing the scattering structures 112 on both electrode layers.

It should be noted that, the numbers of the first scattering holes 1121A, the second scattering holes 1121B and the third scattering holes 1121C on one electrode 11, whether the first scattering holes 1121A completely penetrate through the first electrode layer 1111A, whether the second scattering holes 1121B completely penetrate through the second electrode layer 1111B, and whether the third scattering holes 1121C completely penetrate through the third electrode layer 1111C are not limited in the embodiments of the present disclosure, and may be set by a person skilled in the art on his own initiative according to actual requirements.

Figures 17, 18:
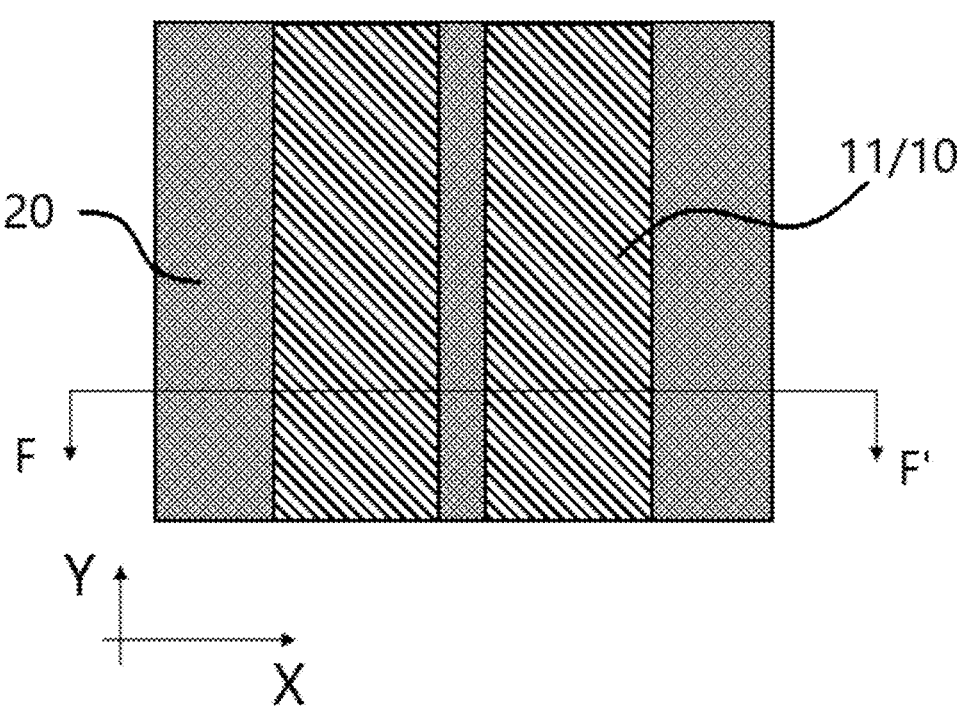
FIG. 17 is a schematic diagram of a partial structure of yet another interdigital resonator provided in an embodiment of the present disclosure.
FIG. 18 is a schematic diagram of a sectional structure of the interdigital resonator provided in FIG. 17 along a section line F-F'.
Figure 19:
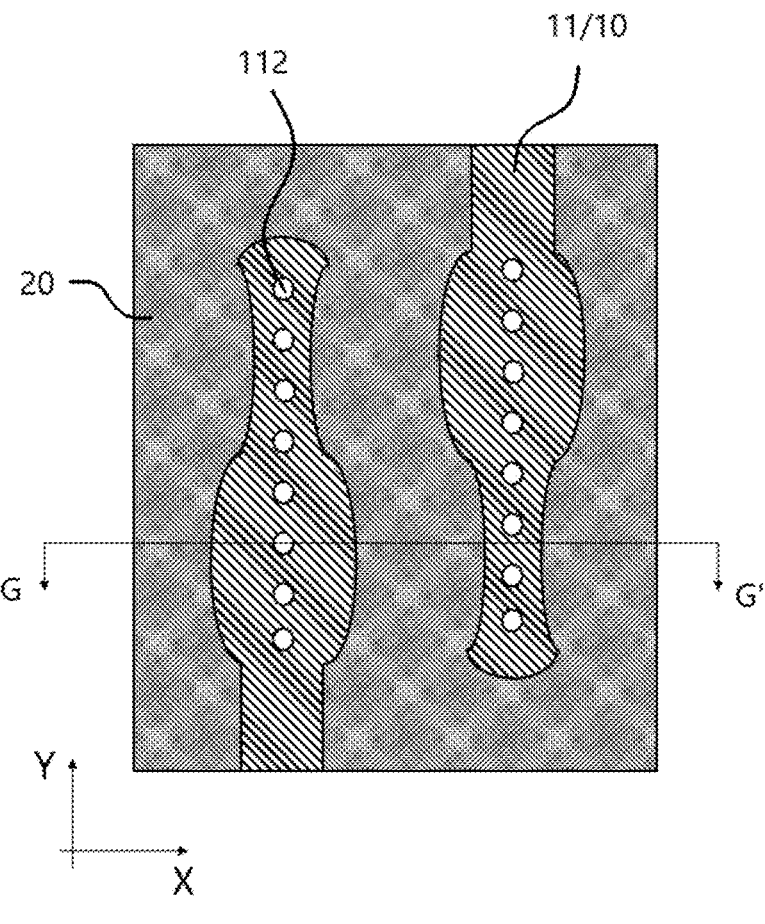
FIG. 19 is a schematic diagram of a partial structure of yet another interdigital resonator provided in an embodiment of the present disclosure.
Figure 20:
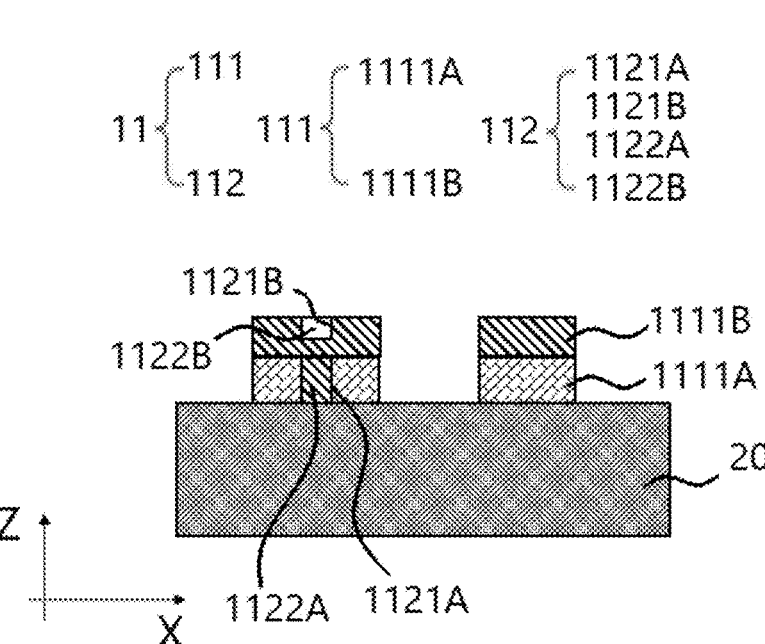
FIG. 20 is a schematic diagram of a sectional structure of the interdigital resonator provided in FIG. 19 along a section line G-G'.
Figure 21:
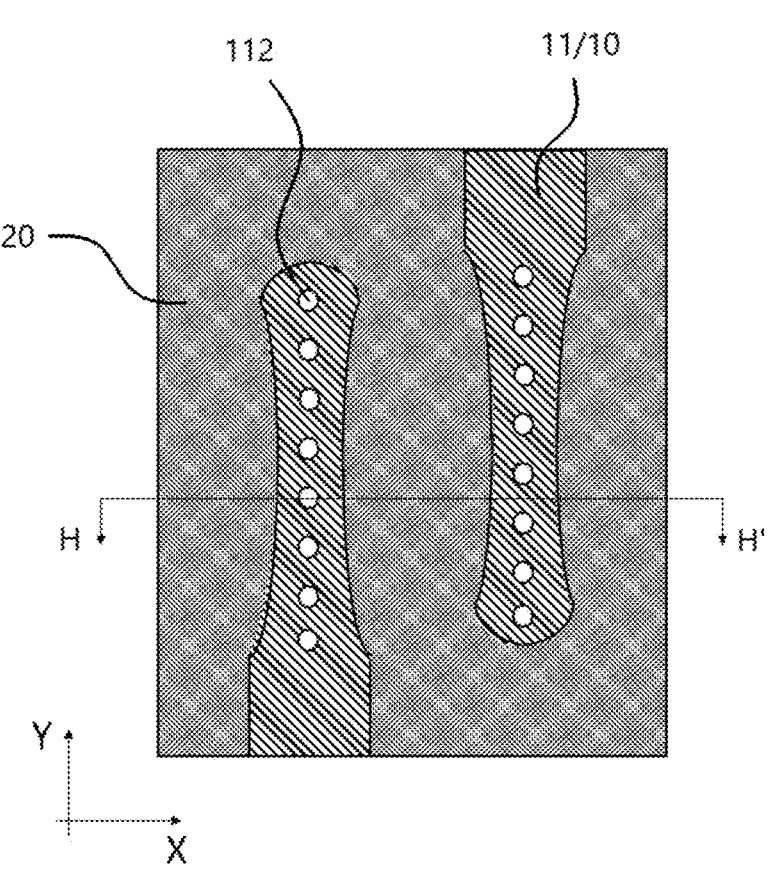
FIG. 21 is a schematic diagram of a partial structure of yet another interdigital resonator provided in an embodiment of the present disclosure.
Figure 22:
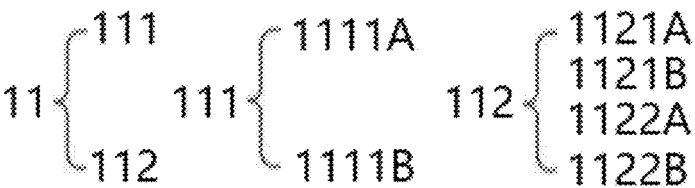
FIG. 22 is a schematic diagram of a sectional structure of the interdigital resonator provided in FIG. 21 along a section line H-H'.
Figure 22:
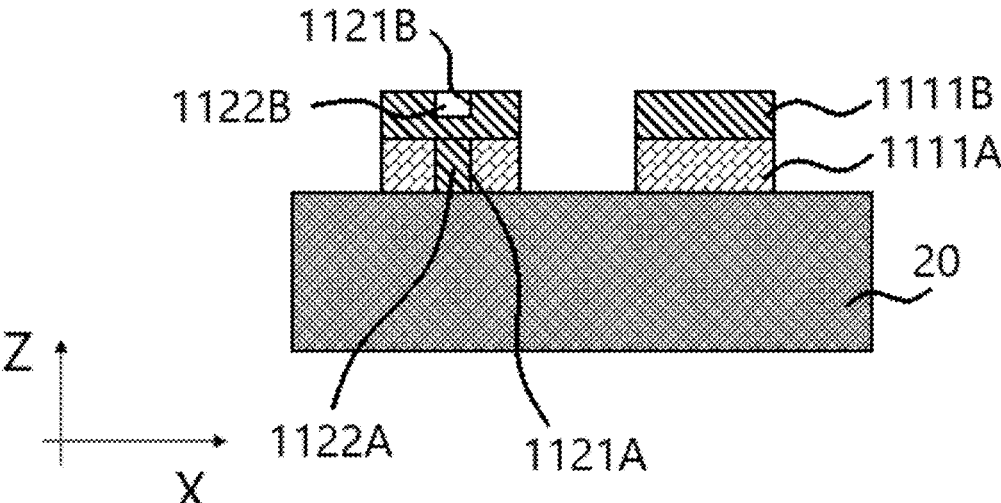

FIG. 17 is a schematic diagram of a partial structure of yet another interdigital resonator provided in an embodiment of the present disclosure. FIG. 18 is a schematic diagram of a sectional structure of the interdigital resonator provided in FIG. 17 along a section line F-F'. FIG. 19 is a schematic diagram of a partial structure of yet another interdigital resonator provided in an embodiment of the present disclosure. FIG. 20 is a schematic diagram of a sectional structure of the interdigital resonator provided in FIG. 19 along a section line G-G'. FIG. 21 is a schematic diagram of a partial structure of yet another interdigital resonator provided in an embodiment of the present disclosure. FIG. 22 is a schematic diagram of a sectional structure of the interdigital resonator provided in FIG. 21 along a section line H-H'. Refer to FIGS. 1-3 and 8-22, the double-layer electrode structure 111 includes a first electrode layer 1111A and a second electrode layer 1111B which are laminated, and the second electrode layer 1111B is located on the side of the first electrode layer 1111A away from the piezoelectric layer 20. The vertical projection of the second electrode layer 1111B on the piezoelectric layer 20 at least partially overlaps with the vertical projection of the first electrode layer 1111A on the piezoelectric layer 20. The shape of the vertical projection of the first electrode layer 1111A on the piezoelectric layer 20 includes a polygon or an irregular shape. The shape of the vertical projection of the second electrode layer 1111B on the piezoelectric layer 20 includes a polygon or an irregular shape.

The area of the orthogonal projection, on the piezoelectric layer 20, of the second electrode layer 1111B of the interdigital transducer 10 as shown in FIGS. 1-3 and 8-12 is smaller than the area of the orthogonal projection of the first electrode layer 1111A on the piezoelectric layer 20. The area of the orthogonal projection, on the piezoelectric layer 20, of the second electrode layer 1111B of the interdigital transducer 10 as shown in FIGS. 13-18 is larger than the area of the orthogonal projection of the first electrode layer 1111A on the piezoelectric layer 20. The area of the vertical projection, on the piezoelectric layer 20, of the second electrode layer 1111B of the interdigital transducer 10 as shown in FIGS. 19-22 is equal to the area of the vertical projection of the first electrode layer 1111A on the piezoelectric layer 20, and it should be noted that, in this case, the maximum input power of the interdigital transducer 10 is the highest. The interdigital transducer 10 shown in FIGS. 15 and 16 further includes a third electrode layer 1111C, wherein the area of the vertical projection of the second electrode layer 1111B on the piezoelectric layer 20 is greater than the area of the vertical projection of the first electrode layer 1111A on the piezoelectric layer 20, and the area of the vertical projection of the third electrode layer 1111C on the piezoelectric layer 20 is less than the area of the vertical projection of the first electrode layer 1111A on the piezo-electric layer 20.

It should be noted that, the number of electrode layers included in the interdigital transducer 10 and the size relationship of the areas of the vertical projections of various electrode layers on the piezoelectric layer 20 are not limited in the embodiments of the present disclosure, and may be set by a person skilled in the art on his own initiative according to actual requirements.

The shape of the orthogonal projection, on the piezoelec-tric layer 20, of the first electrode layer 1111A of the interdigital transducer 10 as shown in FIGS. 1-3 and 8-18 is a rectangle, and the shape of the orthogonal projection of the second electrode layer 1111B on the piezoelectric layer 20 is a rectangle. The shape of the vertical projection, on the piezoelectric layer 20, of the first electrode layer 1111A of the interdigital transducer 10 as shown in FIGS. 19-22 is an irregular closed figure surrounded by straight edges and curved edges, and the shape of the vertical projection of the second electrode layer 1111B on the piezoelectric layer 20 is an irregular closed figure surrounded by straight edges and curved edges.

It should be noted that, the shapes of vertical projections of the first electrode layer 1111A and the second electrode layer 1111B on the piezoelectric layer 20 are not limited in the embodiments of the present disclosure, and may also be parallelogram, triangle, curved polygon, and irregular closed figure formed by straight edges or curved edges.

It should be noted that, the size relationship of the area of the vertical projection of the second electrode layer 1111B on the piezoelectric layer 20 and the area of the vertical projection of the first electrode layer 1111A on the piezo-electric layer 20 is not limited in the embodiments of the present disclosure, and may be set by a person skilled in the art on his own initiative according to actual requirements.

Refer to FIG. 2, the electrode fingers 11 include a plurality of scattering structures 112. The plurality of scattering structures 112 are arranged in an array in the double-layer electrode structure 111.

Exemplarily, each electrode finger 11 shown in FIG. 2 includes seven scattering structures 112, and the seven scattering structures 112 are arranged in an array of seven rows and one column. It should be noted that, the number of the scattering structures 112 included in each of the elec-trode fingers 11 and the arrangement manner of the array of the plurality of scattering structures 112 are not limited in the embodiments of the present disclosure, and may be set by a person skilled in the art on his own initiative according to actual requirements.

As a feasible implementation, the double-layer electrode structure 111 includes a first electrode layer 1111A and a second electrode layer 1111B which are laminated, and the second electrode layer 1111B is located on the side of the first electrode layer 1111A away from the piezoelectric layer 20. The first electrode layer 1111A includes at least one of gold, copper, silver, aluminum, titanium, tungsten, chro-mium, molybdenum, platinum, graphene, diamond, and silicon carbide. The second electrode layer 1111B includes at least one of gold, copper, silver, aluminum, titanium, tung-sten, chromium, molybdenum, platinum, graphene, dia-mond, and silicon carbide.

It should be noted that, the material of the first electrode layer 1111A and the material of the second electrode layer 1111B may be the same or different, which is not limited in the embodiments of the present disclosure.

As a feasible implementation, the interdigital resonator includes a surface acoustic wave resonator, a Lamb wave resonator, a laterally excited acoustic wave resonator, or a laterally vibration resonator.

It should be noted that, when the interdigital resonator is a surface acoustic wave resonator, a substrate should be further provided on the side of the piezoelectric layer 20 away from the interdigital transducer 10, and the substrate may be a single-layer material or a multi-layer material. When the interdigital resonator is a Lamb wave resonator, a laterally excited acoustic wave resonator or a laterally vibration resonator, a substrate may be provided on the side of the piezoelectric layer 20 away from the interdigital transducer 10, or a substrate may not be provided. When a substrate is provided, the substrate may be a single-layer material, and may also be a multi-layer material. When a substrate is provided, the side of the piezoelectric layer 20 away from the interdigital transducer 10 may be provided with a silicon dioxide insulation layer, and may also be in direct contact with air.

In some embodiments, the piezoelectric layer 120 includes aluminum nitride (AlN), aluminum scandium nitride (ScAlN), polyvinylidene fluoride (PVDF), lead zir-conate titanate piezoelectric ceramic (PZT), lead magnesium niobate-lead titanate (PMN-PT), lithium niobate (LiNbO3), lithium tantalate (LiTaO3), sodium niobate (NaNbO3) or zinc oxide (ZnO).

An embodiment of the present disclosure further provides a filter. The filter includes the interdigital resonator accord-ing to any one of the foregoing embodiments. Therefore, the filter includes the technical features of the foregoing filter, and has the beneficial effect of the foregoing dielectric loaded filter. Similarities may be referred to the preceding description.

The specific embodiments do not limit the scope of protection of the present disclosure. It will be apparent to a person skilled in the art that various modifications, combi-nations, sub-combinations, and replacements can be made according to design requirements and other factors. Any modifications, equivalent replacements, improvements, etc. made within the spirit and principle of the present disclosure shall all fall within the scope of protection of the present disclosure.

What is claimed is:

1. An interdigital resonator comprising:

an interdigital transducer; and a piezoelectric layer, wherein:

the interdigital transducer is located on one side of the piezoelectric layer;

the interdigital transducer comprises at least two electrode fingers; and the electrode fingers comprise a double-layer electrode structure and at least one scattering structure provided in the double-layer electrode structure; the double-layer electrode structure comprises at least two laminated electrode layers; and the scattering structure comprises scattering holes and a scattering medium provided in each of the scattering holes, the scattering holes pen-etrates through at least a part of the double-layer electrode structure, and an acoustic impedance of the scattering medium is different from an acoustic impedance of an electrode layer where the scattering medium is located.

2. The interdigital resonator according to claim 1, wherein:

the double-layer electrode structure comprises a first electrode layer and a second electrode layer that are laminated, the second electrode layer being located on the side of the first electrode layer away from the piezoelectric layer;

the scattering structure comprises first scattering holes and first scattering media provided in the first scattering holes;

the first scattering holes penetrate through at least a part of the first electrode layer; and an acoustic impedance of the first scattering medium is different from an acoustic impedance of the first electrode layer.

3. The interdigital resonator according to claim 2, wherein:

a material of the first electrode layer is different from a material of the second electrode layer; and the acoustic impedance of the first scattering medium is the same as an acoustic impedance of the second electrode layer.

4. The interdigital resonator according to claim 1, wherein:

the double-layer electrode structure comprises a first electrode layer and a second electrode layer that are arranged in a stacked manner, the second electrode layer being located on the side of the first electrode layer away from the piezoelectric layer;

the scattering structure comprises second scattering holes and second scattering media provided in the second scattering holes;

the second scattering holes penetrate through at least a part of the second electrode layer; and an acoustic impedance of the second scattering medium is different from an acoustic impedance of the second electrode layer.

5. The interdigital resonator according to claim 1, wherein:

the double-layer electrode structure comprises a first electrode layer and a second electrode layer that are laminated, the second electrode layer being located on the side of the first electrode layer away from the piezoelectric layer;

the scattering structure comprises first scattering holes, second scattering holes, first scattering media provided in the first scattering holes, and second scattering media provided in the second scattering holes;

the first scattering holes penetrate through at least a part of the first electrode layer, and an acoustic impedance of the first scattering medium is different from an acoustic impedance of the first electrode layer; and the second scattering holes penetrate through at least a part of the second electrode layer, and an acoustic impedance of the second scattering medium is different from an acoustic impedance of the second electrode layer.

6. The interdigital resonator according to claim 1, wherein:

the double-layer electrode structure comprises a first electrode layer and a second electrode layer that are laminated, the second electrode layer being located on the side of the first electrode layer away from the piezoelectric layer;

a vertical projection of the second electrode layer on the piezoelectric layer at least partially overlaps with a vertical projection of the first electrode layer on the piezoelectric layer;

a shape of the vertical projection of the first electrode layer on the piezoelectric layer comprises a polygon or an irregular shape; and a shape of the vertical projection of the second electrode layer on the piezoelectric layer comprises a polygon or an irregular shape.

7. The interdigital resonator according to claim 1, wherein the electrode fingers comprise a plurality of scattering structures, and the plurality of the scattering structures are arranged in the double-layer electrode structure in an array.

8. The interdigital resonator according to claim 1, wherein:

the double-layer electrode structure comprises a first electrode layer and a second electrode layer that are laminated, the second electrode layer being located on the side of the first electrode layer away from the piezoelectric layer;

the first electrode layer comprises at least one of gold, copper, silver, aluminum, titanium, tungsten, chromium, molybdenum, platinum, graphene, diamond, and silicon carbide; and the second electrode layer comprises at least one of gold, copper, silver, aluminum, titanium, tungsten, chromium, molybdenum, platinum, graphene, diamond, and silicon carbide.

9. The interdigital resonator according to claim 1, wherein the interdigital resonator comprises a surface acoustic wave resonator, a Lamb wave resonator, a laterally excited acoustic wave resonator, or a laterally vibration resonator.

10. An interdigital filter comprising the interdigital resonator according to claim 1.

11. The interdigital filter according to claim 10, wherein:

the double-layer electrode structure comprises a first electrode layer and a second electrode layer that are laminated, the second electrode layer being located on the side of the first electrode layer away from the piezoelectric layer;

the scattering structure comprises first scattering holes and first scattering media provided in the first scattering holes;

the first scattering holes penetrate through at least a part of the first electrode layer; and an acoustic impedance of the first scattering medium is different from an acoustic impedance of the first electrode layer.

12. The interdigital filter according to claim 11, wherein:

a material of the first electrode layer is different from a material of the second electrode layer; and the acoustic impedance of the first scattering medium is the same as an acoustic impedance of the second electrode layer.

13. The interdigital filter according to claim 10, wherein:

the double-layer electrode structure comprises a first electrode layer and a second electrode layer that are arranged in a stacked manner, the second electrode layer being located on the side of the first electrode layer away from the piezoelectric layer;

the scattering structure comprises second scattering holes and second scattering media provided in the second scattering holes;

the second scattering holes penetrate through at least a part of the second electrode layer; and an acoustic impedance of the second scattering medium is different from an acoustic impedance of the second electrode layer.

14. The interdigital filter according to claim 10, wherein:

the double-layer electrode structure comprises a first electrode layer and a second electrode layer that are laminated, the second electrode layer being located on the side of the first electrode layer away from the piezoelectric layer;

the scattering structure comprises first scattering holes, second scattering holes, first scattering media provided in the first scattering holes, and second scattering media provided in the second scattering holes;

the first scattering holes penetrate through at least a part of the first electrode layer, and an acoustic impedance of the first scattering medium is different from an acoustic impedance of the first electrode layer; and the second scattering holes penetrate through at least a part of the second electrode layer, and an acoustic impedance of the second scattering medium is different from an acoustic impedance of the second electrode layer.

15. The interdigital filter according to claim 10, wherein:

the double-layer electrode structure comprises a first electrode layer and a second electrode layer that are laminated, the second electrode layer being located on the side of the first electrode layer away from the piezoelectric layer;

a vertical projection of the second electrode layer on the piezoelectric layer at least partially overlaps with a vertical projection of the first electrode layer on the piezoelectric layer;

a shape of the vertical projection of the first electrode layer on the piezoelectric layer comprises a polygon or an irregular shape; and a shape of the vertical projection of the second electrode layer on the piezoelectric layer comprises a polygon or an irregular shape.

16. The interdigital filter according to claim 10, wherein the electrode fingers comprise a plurality of scattering structures, and the plurality of the scattering structures are arranged in the double-layer electrode structure in an array.

17. The interdigital filter according to claim 10, wherein:

the double-layer electrode structure comprises a first electrode layer and a second electrode layer that are laminated, the second electrode layer being located on the side of the first electrode layer away from the piezoelectric layer;

the first electrode layer comprises at least one of gold, copper, silver, aluminum, titanium, tungsten, chromium, molybdenum, platinum, graphene, diamond, and silicon carbide; and the second electrode layer comprises at least one of gold, copper, silver, aluminum, titanium, tungsten, chromium, molybdenum, platinum, graphene, diamond, and silicon carbide.

18. The interdigital filter according to claim 10, wherein the interdigital resonator comprises a surface acoustic wave resonator, a Lamb wave resonator, a laterally excited acoustic wave resonator, or a laterally vibration resonator.

* * * * *